United States Patent [19]
Huang et al.

[11] Patent Number: 5,511,096
[45] Date of Patent: Apr. 23, 1996

[54] QUADRATURE AMPLITUDE MODULATED DATA FOR STANDARD BANDWIDTH TELEVISION CHANNEL

[75] Inventors: Zheng Huang, Willow Grove, Pa.; Chris Heegard, Ithaca, N.Y.

[73] Assignee: GI Corporation, Hatboro, Pa.

[21] Appl. No.: 184,499

[22] Filed: Jan. 18, 1994

[51] Int. Cl.$^6$ .............................. H04L 5/12; H04L 27/36; G06F 11/10; H04N 7/12
[52] U.S. Cl. .................... 375/265; 375/264; 375/261; 375/298; 371/43; 348/384
[58] Field of Search .................................. 375/265, 264, 375/262, 261, 298, 341; 371/43; 348/384, 155

[56] References Cited

U.S. PATENT DOCUMENTS

| | | | |
|---|---|---|---|
| 5,023,889 | 6/1991 | Divsalar et al. | 371/43 |
| 5,233,629 | 8/1993 | Paik et al. | |
| 5,321,725 | 6/1994 | Paik et al. | 348/155 |
| 5,363,408 | 11/1994 | Paik et al. | 375/261 |

*Primary Examiner*—Edward L. Coles, Sr.
*Assistant Examiner*—Allan A. Esposo
*Attorney, Agent, or Firm*—Barry R. Lipsitz

[57] ABSTRACT

An outer symbol error correcting code is concatenated with a punctured multidimensional trellis code to provide an optimal scheme for communicating digital television signals in a standard (e.g., approximately six MHz) bandwidth channel via a cable television network or the like. An input signal is encoded using an outer symbol error correcting code to produce successive blocks. Each block comprises N seven-bit coded symbols of which M represent information to be communicated and the remaining N-M coded symbols comprise error correcting information. M/N is either 120/126, 121/127 or 122/128. The blocks are interleaved, and may be supplemented with control symbols that include a synchronization pattern for M/N=121/127 or M/N=122/128. The interleaved blocks are convolutionally encoded using an inner trellis code having a punctured rate 4/5 (sixty-four QAM) or 3/4 (sixteen QAM). The output symbols are multilevel modulated for transmission over a communication path using, for example, sixteen or sixty-four QAM. The transmitted symbols are decoded using a trellis decoder, deinterleaved, and further decoded in an outer symbol error decoder concatenated with the inner trellis decoder.

25 Claims, 3 Drawing Sheets

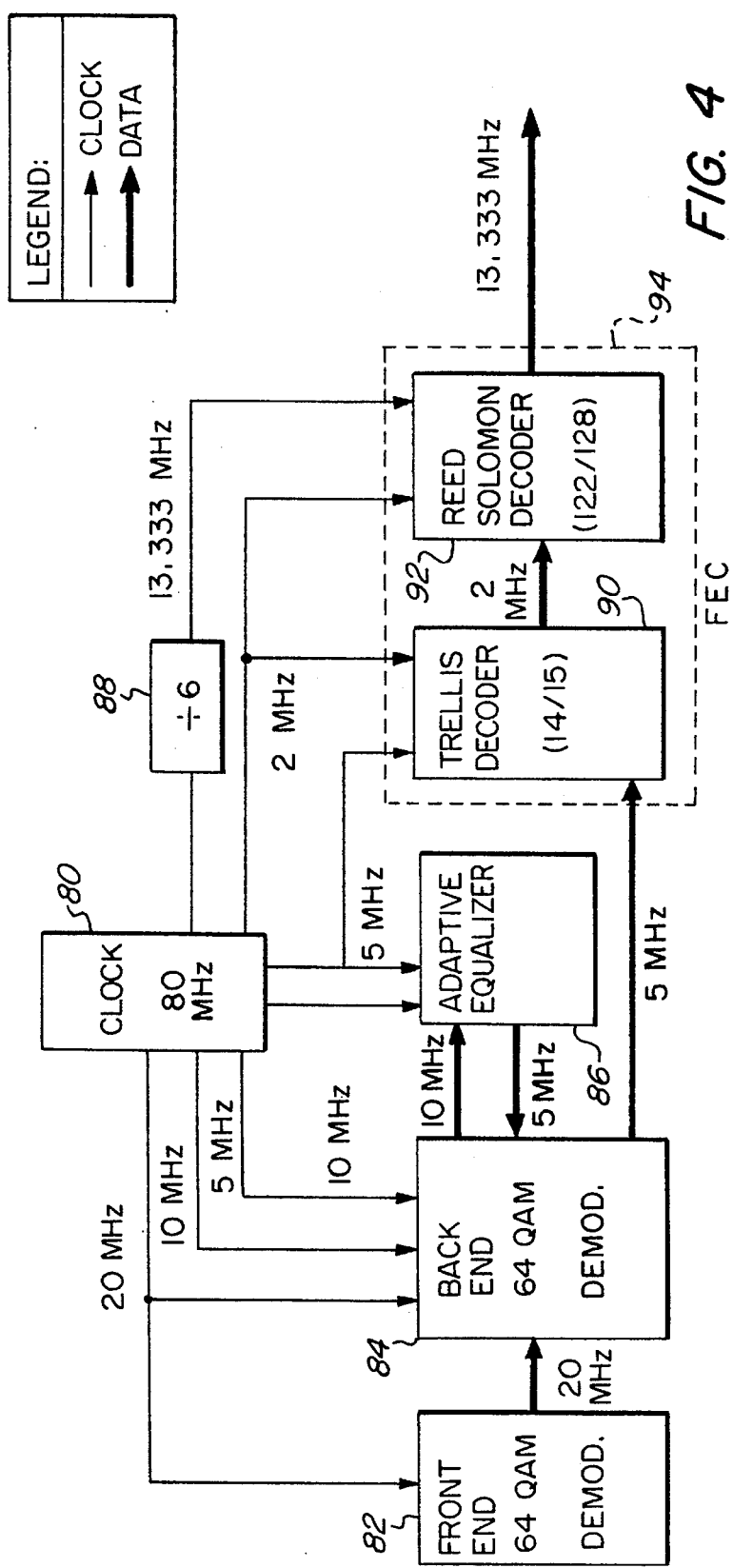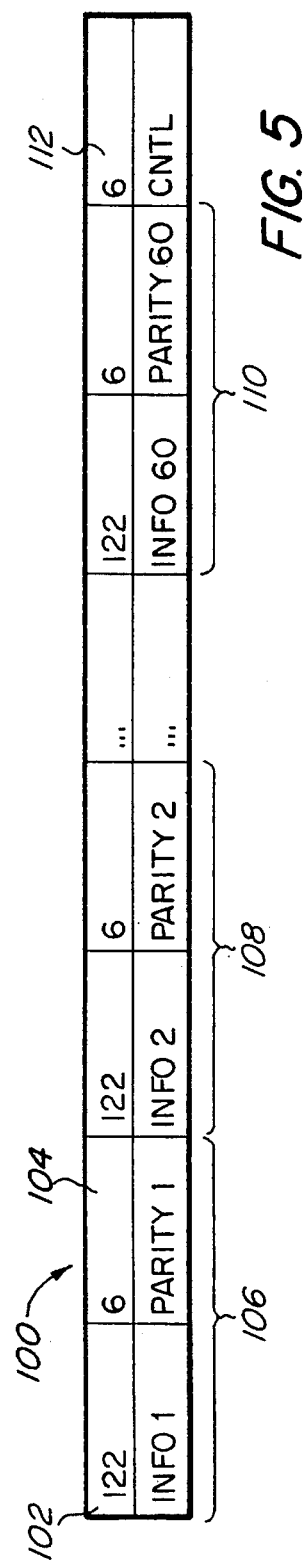

QUADRATURE AMPLITUDE MODULATED DATA FOR STANDARD BANDWIDTH TELEVISION CHANNEL

BACKGROUND OF THE INVENTION

The present invention relates to trellis coded quadrature amplitude modulation (QAM) and more particularly to a practical method for coding 16 and 64 QAM transmission to enable a low-cost implementation of a digital cable television system or the like.

Digital data, for example digitized video for use in broadcasting digitized conventional or high definition television (HDTV) signals, can be transmitted over satellite, terrestrial or cable VHF or UHF analog channels for communication to end users. Analog channels deliver corrupted and transformed versions of their input waveforms. Corruption of the waveform, usually statistical, may be additive and/or multiplicative, because of possible background thermal noise, impulse noise, and fades. Transformations performed by the channel are frequency translation, nonlinear or harmonic distortion and time dispersion.

In order to communicate digital data via an analog channel, the data is modulated using, for example, a form of pulse amplitude modulation (PAM). Typically, quadrature amplitude modulation (QAM) is used to increase the amount of data that can be transmitted within an available channel bandwidth. QAM is a form of PAM in which a plurality of bits of information are transmitted together in a pattern referred to as a "constellation" that can contain, for example, sixteen, thirty-two or sixty-four points. An example of a system for communicating digital data using QAM, and specifically trellis coded QAM, is provided in U.S. Pat. No. 5,233,629 to Paik, et al., incorporated herein by reference.

In pulse amplitude modulation, each signal is a pulse whose amplitude level is determined by a transmitted symbol. In 16-bit QAM, symbol amplitudes of −3, −1, 1 and 3 in each quadrature channel (I and Q) are typically used. Bandwidth efficiency in digital communication systems is defined as the number of transmitted bits per second per unit of bandwidth, i.e., the ratio of the data rate to the bandwidth. Modulation systems with high bandwidth efficiency are employed in applications that have high data rates and small bandwidth occupancy requirements. One such application is the transmission of television signals in a standard 6 MHz or so bandwidth. QAM provides bandwidth efficient modulation that is useful for such applications.

Trellis coded modulation (TCM) has evolved as a combined coding and modulation technique for digital transmission over band limited channels. It allows the achievement of significant coding gains over conventional uncoded multilevel modulation, such as QAM, without compromising bandwidth efficiency. TCM schemes utilize redundant nonbinary modulation in combination with a finite-state encoder which governs the selection of modulation signals to generate coded signal sequences. In the receiver, the noisy signals are decoded by a soft-decision maximum likelihood sequence decoder. Such schemes can improve the robustness of digital transmission against additive noise by 3–6 dB or more, compared to conventional uncoded modulation. These gains are obtained without significant bandwidth expansion or reduction of the effective information rate as required by other known error correction schemes. The term "trellis" is used because these schemes can be described by a state-transition (trellis) diagram similar to the trellis diagrams of binary convolutional codes. The difference is that TCM extends the principles of convolutional coding to nonbinary modulation with signal sets of arbitrary size.

For applications that are band limited, and require low cost components (particularly low cost data decoders), conventional QAM systems have not been feasible due to the complexity and relatively high cost of the required encoder and decoder circuits. In fact, it is typical to implement QAM trellis encoders and decoders in expensive custom integrated circuit chips.

One band limited application in which a low cost solution is necessary for communicating digital data is the digital communication of cable television signals, which may include compressed conventional or high definition television signals. Systems for transmitting such signals have data rate requirements on the order of 15–30 megabits per second (Mbps), bandwidth occupancy requirements on the order of 6 MHz (the bandwidth of a conventional National Television System Committee (NTSC) television channel), and very high data reliability requirements (i.e., a very small bit error rate). The data rate requirement arises from the need to provide a high quality compressed television picture. The bandwidth constraint is a consequence of the U.S. Federal Communications Commission requirement that such signals occupy existing 6 MHz television channels, and must coexist with the current broadcast NTSC signals. Similar constraints are mandated by the PAL (Phase Alternating Line) and SECAM (Sequential Color and Memory) television systems used outside the U.S.

The combination of data rate and bandwidth occupancy requirements mandated by the standard television transmission systems dictates a modulation system that has high bandwidth efficiency. Indeed, the ratio of data rate to bandwidth must be on the order of 3 to 6. This means that a bandwidth efficient modulation such as QAM is required. However, as noted above, QAM systems have been too expensive to implement for high volume consumer applications.

The requirement for a very high data reliability in digitized video applications results from the fact that highly compressed source material (i.e., the compressed video) is intolerant of channel errors. The natural redundancy of the signal has been removed in order to obtain a concise description of the intrinsic value of the data. For example, for a system to transmit at 15 Mbps for a twenty-four hour period, with less than one bit error, requires the bit error rate (BER) of the system to be less than one error in $10^{12}$ transmitted bits.

Data reliability requirements are often met in practice via the use of concatenated coding techniques, which is a divide and concur approach to problem solving. In such a coding framework, two codes are employed. An "inner" modulation code cleans up the channel and delivers a modest symbol error rate to an "outer" decoder. The inner code is usually a coded modulation that can be effectively decoded using "soft decisions" (i.e., finely quantized channel data). A known approach is to use a convolutional or trellis code as the inner code with some form of the "Viterbi algorithm" as a trellis decoder. The outer code is most often a t-error-correcting, "Reed-Solomon" code. Such Reed-Solomon coding systems, that operate in the data rate range required for communicating digital television data, are widely available and have been implemented in the integrated circuits of several vendors. The outer decoder removes the vast majority of symbol errors that have eluded the inner decoder in such a way that the final output error rate is extremely small.

A more detailed explanation of concatenated coding schemes can be found in G. C. Clark, Jr. and J. B. Cain, "Error-Correction Coding for Digital Communications", Plenum Press, New York, 1981; and S. Lin and D. J. Costello, Jr., "Error Control Coding: Fundamentals and Applications", Prentice-Hall, Englewood Cliffs, N.J., 1983. Trellis coding is discussed extensively in G. Ungerboeck, "Channel Coding with Multilevel/Phase Signals", *IEEE Transactions on Information Theory*, Vol. IT-28, No. 1, pp. 55–67, January 1982; G. Ungerboeck, "Trellis-Coded Modulation with Redundant Signal Sets—Part I: Introduction,—Part II: State of the Art", *IEEE Communications Magazine*, Vol. 25, No. 2, pp. 5–21, February 1987; and A. R. Caulderbank and N. J. A. Sloane, "New Trellis Codes Based on Lattices and Cosets", *IEEE Transactions on Information Theory*, Vol. IT-33, No. 2, pp. 177–195, March 1987. The Viterbi algorithm is explained in G. D. Forney, Jr., "The Viterbi Algorithm", *Proceedings of the IEEE*, Vol. 61, No. 3, March 1973. Reed-Solomon coding systems are discussed in the Clark, Jr. et al and Lin et al texts cited above.

The error rate performance at the output of the inner, modulation code in concatenated coded systems is highly dependent on signal-to-noise ratio (SNR). Some codes perform better, providing a lower error rate, at a low SNR while others perform better at a high SNR. This means that the optimization of the modulation code for concatenated coding systems can lead to different solutions, depending on the specified SNR range. To date, an optimal solution has eluded system designers.

It would be advantageous to provide an optimized data modulation system with high bandwidth efficiency and low power requirements. Such a system should provide a high data rate, with minimal bandwidth occupancy, and very high data reliability. The complexity of a receiver for use with such a system should be minimized, to provide low cost in volume production.

The present invention provides a modulation system having the aforementioned advantages. In particular, the method and apparatus of the present invention provide a concatenated coding implementation wherein the inner trellis coding rate and the outer Reed-Solomon error correction rate are optimized to provide an integer relationship between the various clocks required by the system (enabling a low cost and easily implemented clock design) while achieving excellent coding gain at a desired symbol rate and bandwidth. The invention achieves very high (e.g., 7 dB) coding gain, requires a very small transmission overhead, and provides a simple scheme for Reed-Solomon synchronization, including Reed-Solomon symbol synchronization, block synchronization, interleave block synchronization, trellis symbol synchronization and frame synchronization. These advantages all combine to provide a very robust system that is low in cost, easy to initialize, and allows synchronization to be easily regained if lost.

SUMMARY OF THE INVENTION

In accordance with the present invention, a method is provided for concatenating an outer symbol error correcting code (e.g., a Reed-Solomon algorithm) with a multidimensional trellis code for use in communicating digital data within a standard (e.g., approximately six MHz) bandwidth television channel. An input signal is encoded using the outer symbol error correcting code to produce successive blocks. Each block comprises N seven-bit coded symbols of which M coded symbols represent information to be communicated and the remaining N-M coded symbols comprise error correcting overhead. M/N is one of 121/127 and 122/128. The symbols in each block are interleaved for transmission in an interleaved order to minimize the effects of burst errors when recovering the input signal after transmission. A seven-bit control symbol is provided for each frame of F blocks, where F=10 when M/N is 122/128 and F=20 when M/N=121/127. The addition of the control symbols effectively lowers the ratio of M/N to an actual information to transmitted data ratio of 120/126=20/21.

The control symbols contain synchronization information necessary to synchronize the recovery of information at a receiver. The blocks are convolutionally encoded using an inner convolutional coding algorithm having a rate 4/5 or 3/4. In this manner, for a sixteen QAM implementation four two-bit output symbols are provided for each seven input bits for each of the I and Q QAM components, and for a sixty-four QAM implementation five three-bit output symbols are provided for each pair of seven-bit (2×7=14 bits) coded symbols. The 3/4 rate for sixteen QAM and 4/5 rate for sixty-four QAM allows for a single or double seven-bit symbol. The two-bit (sixteen QAM) or three-bit (sixty-four QAM) output symbols are multilevel modulated for transmission over a communication path.

The multilevel modulated two or three-bit output symbols are decoded after receipt from a communication path by demodulating them for decoding using a rate 3/4 or 4/5 decoding algorithm to recover the blocks of seven-bit coded symbols and said control symbols. One seven bit coded and/or control symbol is provided for each group of four of the received two-bit output symbols in the sixteen QAM embodiment. Two seven-bit coded and/or control symbols are provided for each group of five of the received three-bit output symbols in the sixty-four QAM embodiment. The recovered blocks are deinterleaved after stripping the control bits therefrom. The seven-bit coded symbols in the deinterleaved blocks are decoded using an algebraic symbol error correcting algorithm that corresponds to the outer symbol error correcting code to recover the input signal. In the illustrated embodiment, the outer symbol error correcting code comprises a Reed-Solomon algorithm and the multilevel modulating step uses either sixteen QAM or sixty-four QAM to modulate the output symbols. The rate 3/4 or 4/5 decoding algorithm is a Viterbi decoding algorithm and the algebraic symbol error correcting algorithm is a Reed-Solomon decoding algorithm.

An encoder is provided in accordance with the invention for concatenating an outer symbol error correcting code with a multidimensional trellis code to efficiently communicate digital data within a standard bandwidth television channel using multilevel modulation. An outer symbol error encoder is provided for encoding an input signal to produce successive data blocks. Each block comprises N seven-bit coded symbols of which M coded symbols represent information to be communicated. The remaining N-M coded symbols comprise error correcting overhead. M/N is one of 121/127 and 122/128. Means are provided for interleaving the symbols in each block for transmission in an interleaved order to minimize the effects of burst errors when recovering the input signal after transmission. A seven-bit control symbol is provided for each frame of F blocks, where F=10 when M/N is 122/128 and F=20 when M/N=121/127. The addition of the control symbols effectively lowers the ratio of M/N to an actual information to transmitted data ratio of 120/126=20/21. The control symbols contain synchronization information necessary to synchronize the recovery of information at a receiver. A rate 4/5 convolutional encoder is concatenated with the outer symbol error encoder for convolutionally encoding the blocks and control symbols to provide five three-bit output symbols for two of the seven-bit coded symbols for each of I and Q in a sixty-four QAM embodiment. In a sixteen QAM embodiment, a rate 3/4 encoder provides four two-bit output symbols for each seven bits in a stream of consecutive seven-bit coded symbols. Means are also provided for multilevel modulating the two or three-bit output symbols for transmission over a communication path.

In a preferred embodiment, the outer symbol error encoder comprises a Reed-Solomon encoder. The modulating means comprise one of a sixteen QAM and sixty-four QAM modulator. The convolutional encoder is a trellis encoder.

A decoder is provided for decoding the convolutionally encoded blocks provided by the encoder. The decoder includes means for receiving and demodulating the output symbols from the communication path. An inner decoder is provided for decoding the demodulated output symbols using a rate 3/4 or 4/5 code to recover the blocks of seven-bit coded symbols and the control symbols. Two of the seven-bit coded symbols and/or control symbols are provided for each group of five three-bit output symbols received from the communication path in the sixty-four QAM embodiment. One seven-bit coded symbol or control symbol is provided for each group of four two-bit output symbols received in the sixteen QAM embodiment. Means are provided for deinterleaving the recovered blocks after the control symbols have been stripped therefrom. An outer symbol error decoder is concatenated with the inner decoder for decoding the blocks from the inner decoder to recover the input signal. In a preferred embodiment, the inner decoder is a Viterbi decoder and the outer symbol error decoder is a Reed-Solomon decoder.

A decoder is provided for multilevel modulated digital data communicated in a standard bandwidth television channel. Means are provided for receiving and demodulating convolutionally encoded output symbols from a communication path. An inner decoder is provided for decoding the demodulated output symbols using a rate 3/4 or 4/5 code to recover interleaved blocks of data. Each block comprises N seven-bit coded symbols of which M coded symbols represent information to be recovered. The remaining N-M parity symbols comprise error correcting redundancy. M/N is one of 121/127 and 122/128. The inner decoder also recovers a seven-bit control symbol for each frame F of blocks, where F=10 when M/N is 122/128 and F=20 when M/N is 121/127. The control symbols effectively lower the ratio of M/N to an actual information to transmitted data ratio of 120/126=20/21. Two of the seven-bit coded and/or synchronization symbols are provided for each group of five of the three-bit output symbols received from the communication path in a sixty-four QAM implementation. For sixteen QAM, each group of four two-bit output symbols received provides seven bits for assembly into successive seven-bit coded and/or synchronization symbols.

Means are provided for deinterleaving the recovered blocks after the control symbols have been stripped therefrom. An outer symbol error decoder is concatenated with the inner decoder for decoding the blocks from the inner decoder in response to the control symbols to recover a transmitted information signal. The inner decoder is a Viterbi decoder and the outer symbol error decoder is a Reed-Solomon decoder.

It is possible to implement the present invention in a system where separate control symbols are not necessary to obtain synchronization. For example, synchronization information can be provided as part of the transmitted information data. In order to accommodate such a scheme, a method is provided for concatenating an outer symbol error correcting code (e.g., a Reed-Solomon algorithm) with a punctured multidimensional trellis code for use in communicating digital data within an approximately six MHz bandwidth television channel. An input signal is encoded using the outer symbol error correcting code to produce successive blocks. Each block comprises N seven-bit coded symbols of which M coded symbols represent information to be communicated and the remaining N-M coded symbols comprise error correcting overhead. M/N is one of 120/126, 121/127, and 122/128. The symbols in each block are interleaved for transmission in an interleaved order to minimize the effects of burst errors when recovering the input signal after transmission. The blocks are convolutionally encoded using an inner convolutional coding algorithm having a rate 3/4 or 4/5. In this manner, five three-bit output symbols are provided for each pair of seven-bit coded symbols in a sixty-four QAM embodiment. In a sixteen QAM embodiment, four two-bit output symbols are provided for each seven successive bits of the coded input symbols. The two or three-bit output symbols are multilevel modulated for transmission over a communication path.

The multilevel modulated output symbols are decoded after receipt from a communication path using a rate 3/4 or 4/5 decoding algorithm. Two seven-bit coded symbols are provided for each group of five of the received three-bit output symbols in the sixty-four QAM mode and nine successive bits are provided for each group of five of the received two-bit output symbols in the sixteen QAM mode. The recovered blocks are deinterleaved. The coded symbols in the deinterleaved blocks are decoded using an algebraic symbol error correcting algorithm that corresponds to the outer symbol error correcting code to recover the input signal. In the illustrated embodiment, the outer symbol error correcting code comprises a Reed-Solomon algorithm. The rate 3/4 or 4/5 decoding algorithm is a Viterbi decoding algorithm and the algebraic symbol error correcting algorithm is a Reed-Solomon decoding algorithm.

An encoder is provided in accordance with the invention for concatenating an outer symbol error correcting code with a multidimensional trellis code to efficiently communicate digital data within a standard bandwidth television channel using multilevel modulation. An outer symbol error encoder is provided for encoding an input signal to produce successive data blocks. Each block comprises N seven-bit coded symbols of which M coded symbols represent information to be communicated. The remaining N-M coded symbols comprise error correcting overhead. M/N is one of 120/126, 121/127 and 122/128. Means are provided for interleaving the symbols in each block for transmission in an interleaved order to minimize the effects of burst errors when recovering the input signal after transmission. The interleaver can comprise a $2^n/N$ interleaver, where N is an integer from one to six and $2^n$ represents the maximum burst length to be dispersed. Such an interleaver will spread the burst error over a full block (N) of the seven-bit coded symbols. A rate 3/4 or 4/5 convolutional encoder is concatenated with the outer symbol error encoder for convolutionally encoding the blocks to provide five three-bit output symbols for two of the seven-bit coded symbols (sixty-four QAM) or four two-bit output symbols for every seven bits of the coded symbols (sixteen QAM). Means are also provided for multilevel modulating the output symbols for transmission over a communication path.

In a preferred embodiment, the outer symbol error encoder comprises a Reed-Solomon encoder. The modulating means comprise one of a sixteen QAM and sixty-four QAM modulator. The convolutional encoder is a trellis encoder.

A decoder is provided for decoding the convolutionally encoded blocks provided by the encoder. The decoder includes means for receiving and demodulating the output symbols from the communication path. An inner decoder is provided for decoding the demodulated output symbols using a rate 3/4 or 4/5 code to recover the blocks of seven-bit coded symbols. Means are provided for deinterleaving the recovered blocks. An outer symbol error decoder is concatenated with the inner decoder for decoding the blocks from the inner decoder to recover the input signal. In a preferred embodiment, the inner decoder is a Viterbi decoder and the outer symbol error decoder is a Reed-Solomon decoder.

A decoder is provided for multilevel modulated digital data communicated in a standard bandwidth television channel. Means are provided for receiving and demodulating convolutionally encoded output symbols from a communication path. An inner decoder is provided for decoding the demodulated output symbols using a rate 3/4 or 4/5 code to recover interleaved blocks of data. Each block comprises N seven-bit coded symbols of which M coded symbols represented information to be recovered. The remaining N-M coded symbols comprise error correcting overhead. M/N is one of 120/126, 121/127 and 122/128. Means are provided for deinterleaving the recovered blocks. An outer symbol error decoder is concatenated with the inner decoder for decoding the blocks from the inner decoder to recover a transmitted information signal. In a preferred embodiment, the multilevel modulated digital data is one of sixteen QAM and sixty-four QAM data. The inner decoder is a Viterbi decoder and the outer symbol error decoder is a Reed-Solomon decoder.

BRIEF DESCRIPTION OF THE DRAWINGS

FIG. 4 is a block diagram of the receiver portion of a particular embodiment of the present invention, illustrating the integer relationships between various receiver clock signals; and FIG. 5 is a diagrammatic illustration of a superframe of blocks provided by an outer symbol error correcting code with inserted control symbols in accordance with the present invention.

DETAILED DESCRIPTION OF A PREFERRED EMBODIMENT

Figure 1:
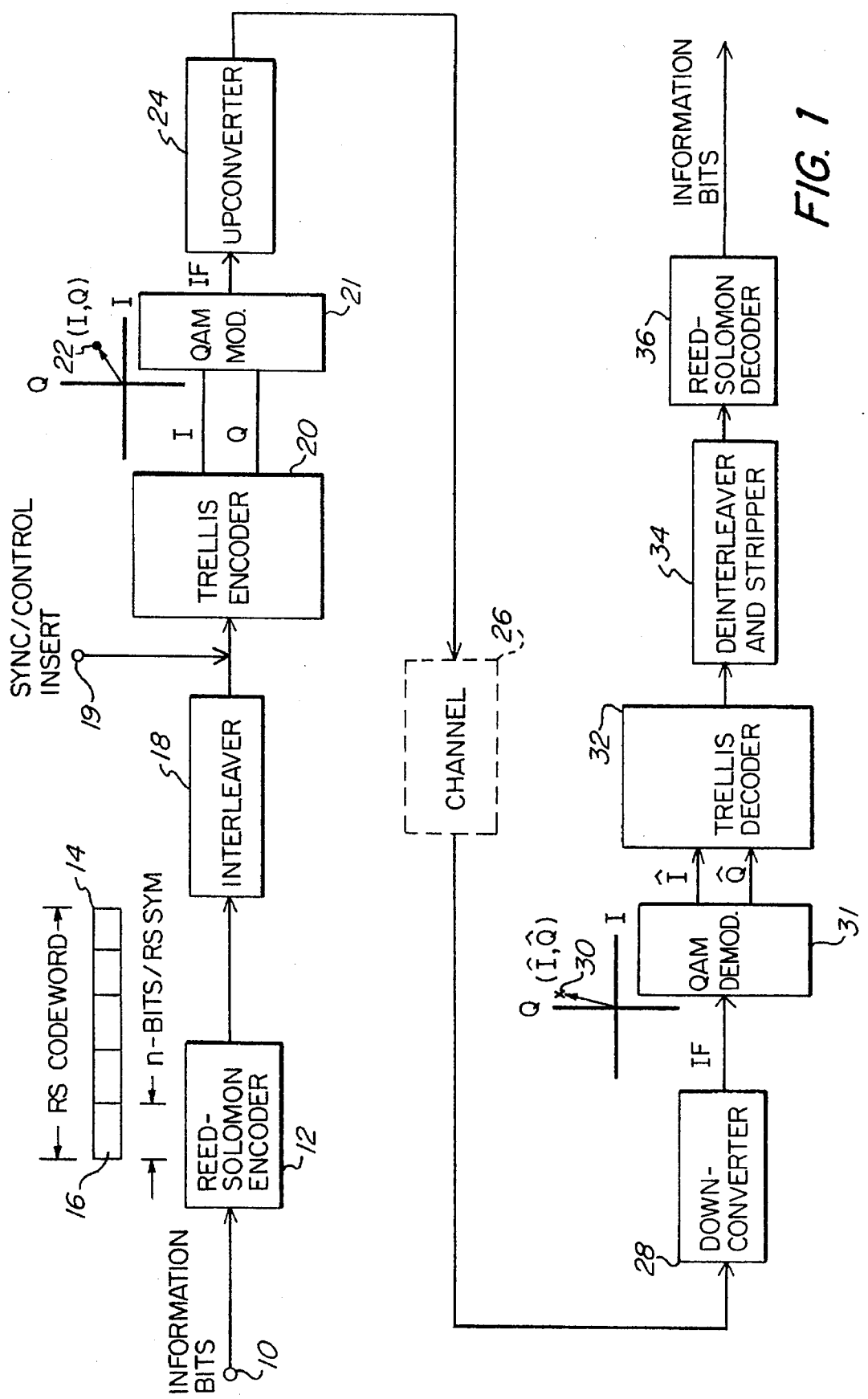
FIG. 1 is a block diagram of a QAM transmission system employing concatenated coding.

FIG. 1 illustrates a concatenated coding system for communicating QAM data. Digital information to be transmitted is input to a symbol error correcting coder 12, such as a Reed-Solomon encoder, via an input terminal 10. Encoder 12 converts the information into a block 14 ("RS Codeword"), comprising a plurality N of successive n-bit coded symbols 16, where n=7. Of the N coded symbols, M represent the actual information to be communicated and the remaining N-M parity symbols comprise error correcting redundancy.

While an outer convolutional code could be used for encoder 12, the bursty nature of the errors in a transmission system, the fact that only hard quantized data is available, and the desirability of a high rate code make a Reed-Solomon code, whose symbols are formed from n-bit segments of the binary stream, a good choice for the outer code. Since the performance of a Reed-Solomon code only depends on the number of symbol errors in the block, such a code is undisturbed by burst errors within an n-bit symbol. However, the concatenated system performance is severely degraded by long bursts of symbol errors. Therefore, an interleaver 18 is provided at the output of Reed-Solomon encoder 12, to interleave the symbols (as opposed to individual bits) between coding operations. The intent of the interleaving is to break up the bursts of symbol errors.

It may be desirable to insert synchronization information into the transmitted data stream. This may be required, for example, where the information data being communicated does not already contain synchronization information. In such a case, after the Reed-Solomon symbols are interleaved, control symbols (which include synchronization symbols) are added via terminal 19 at a rate of one seven-bit control symbol for each frame of Reed-Solomon blocks. In the illustrated embodiments, each Reed-Solomon block comprises either 126, 127 or 128 Reed-Solomon symbols, although the control symbols are only added when blocks of 127 or 128 Reed-Solomon symbols are being processed. A frame comprises F such blocks. Where the blocks contain 128 Reed-Solomon symbols, including 122 information symbols and six parity symbols, F=10. Where each block contains 127 Reed-Solomon symbols, including 121 information symbols and six parity symbols, F=20.

The interleaved Reed-Solomon symbols (with added control symbols, when required) are input to a trellis encoder 20 and QAM modulator 21. The output of modulator 21 comprises symbols representative of coordinates in the real (I) and imaginary (Q) planes of a QAM constellation pattern. One such constellation point 22 is symbolically illustrated in FIG. 1. The symbols are transmitted by a conventional transmitter 24 via a communication channel 26. The communication channel introduces various distortions and delays that corrupt the signal before it is received by a receiver 28. As a result, the coordinate values embodied in the received symbols will not correlate exactly with the transmitted coordinate values, such that a received point 30 will end up on the constellation pattern in a different location than the actual transmitted point 22. In order to determine the correct location for the received point, and thereby obtain the data as actually transmitted, the received data (I, Q) is demodulated in a QAM demodulator 31 and input to a trellis decoder 32 that uses a soft-decision convolutional decoding algorithm to recover the transmitted information. A decoder in accordance with the present invention is described in greater detail below.

The decoded output from decoder 32 is input to a deinterleaver and control symbol stripper 34 that strips out the control symbols (if provided) and reverses the effects of interleaver 18 discussed above. The deinterleaved data is input to a Reed-Solomon decoder 36 for recovery of the original information bits.

Figure 2:
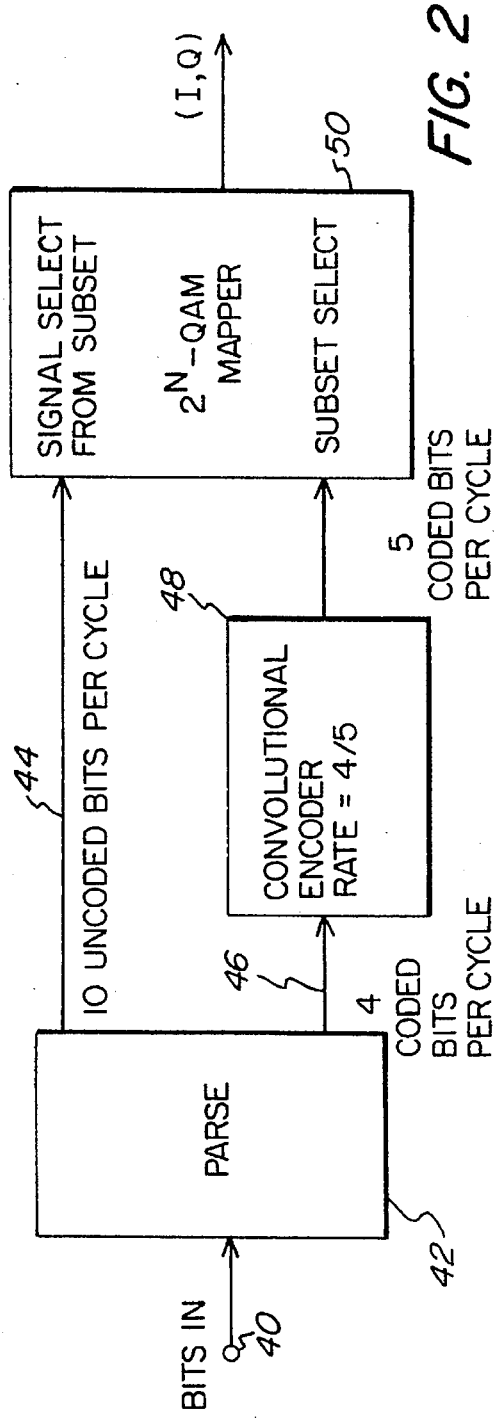
FIG. 2 is a block diagram of a trellis encoder in accordance with the present invention.

FIG. 2 illustrates an encoder in accordance with the present invention. Data bits (e.g., from interleaver 18—FIG. 1) are input to a conventional parsing circuit 42 via an input terminal 40. In accordance with the specific requirements of the sixty-four QAM implementation of the invention, each group of fourteen bits of the interleaved Reed-Solomon data to be transmitted (i.e., two seven-bit Reed-Solomon symbols for either I or Q) is parsed into ten "uncoded" bits for output on line 44 directly to QAM mapper 50 and four "coded" bits for output on line 46 to a convolutional encoder 48. Convolutional encoder 48 employs a punctured rate 4/5, 16-state trellis code, in which the generators are 25 and 37 in octal. The five bits output from encoder 48 for each four bits input thereto and the ten uncoded bits (fifteen bits total for each fourteen bits of I or Q data input to parsing circuit 42) are presented to the QAM mapper 50 as labels which map to five three-bit symbols for transmission. Thus, the equivalent of two seven-bit Reed-Solomon symbols (fourteen bits total) are transmitted as five three-bit, sixty-four QAM symbols, corresponding to I or Q in the transmitted constellation pattern.

A sixteen QAM implementation is similar, except that parsing circuit 42 provides four uncoded and three coded bits per cycle, such that QAM mapper 50 will receive a total of eight bits total each cycle (four uncoded and four coded after the rate 3/4 convolutional encoder) as labels to map to four two-bit symbols for transmission. Thus, seven bits of the Reed-Solomon symbols are transmitted as four two-bit sixteen QAM symbols, corresponding to I or Q in the transmitted constellation pattern.

Figure 3:
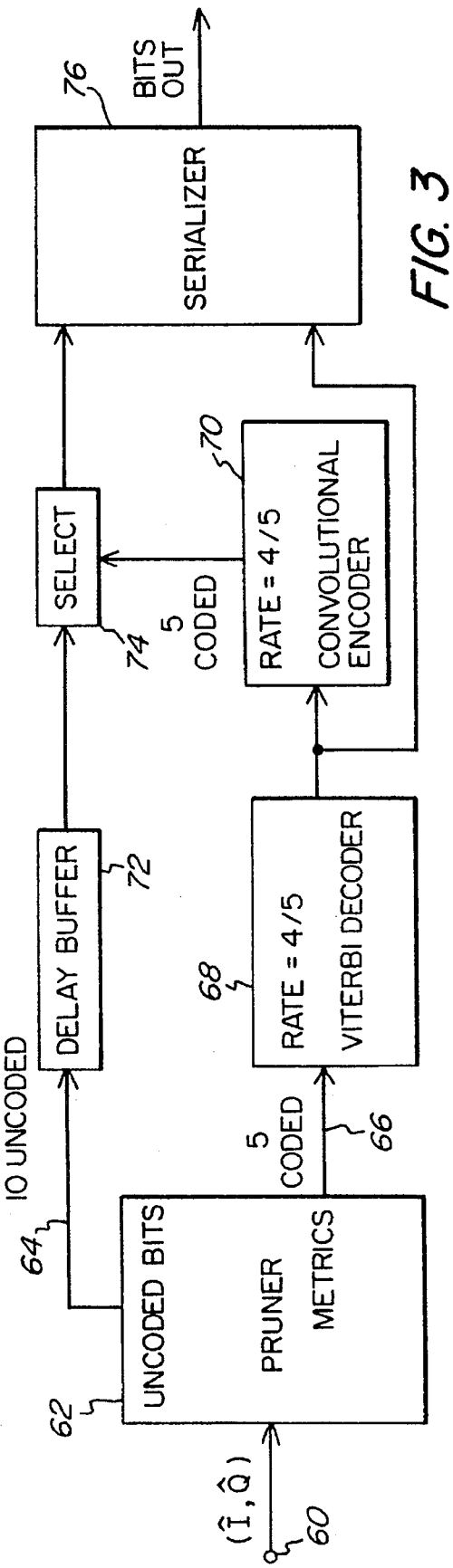
FIG. 3 is a block diagram of a trellis decoder in accordance with the present invention.

FIG. 3 illustrates an implementation of a sixty-four QAM trellis decoder in accordance with the present invention. The received symbol data is input to a pruner 62 via an input terminal 60. Pruner 62 processes the recovered modulation function to provide a set of metrics corresponding to the transmitted coded bits and to provide a plurality of subgroups representing a plurality of conditional determinations of the signal point identified by the transmitted uncoded bits. For each five bits output on line 66 to a rate 4/5 16-state Viterbi decoder 68, four decoded bits are provided at the output of the Viterbi decoder. The conditional determinations of the uncoded bits are output on line 64. The Viterbi decoder 68 can be a rate 1/2 decoder that is punctured to rate 4/5 using well known puncture techniques as disclosed, for example, in Y. Yasuda, et al., "High-Rate Punctured Convolutional Codes for Soft Decision Viterbi Decoding," *IEEE Transactions on Communications*, Vol. COM-32, No. 3, March, 1984, pp. 315–318.

For a sixteen QAM implementation, decoder 68 is replaced with a rate 3/4 decoder. For each four bits output on line 66 to the decoder, three decoded bits are provided. The rate 3/4 decoder can be a rate 1/2 Viterbi decoder punctured to rate 3/4 as well known in the art.

Pruner 62 can comprise a memory device, such as a programmable read only memory (PROM), that stores a look-up table containing precomputed sets of metrics and conditional determinations for different sets of input values $(\hat{I}, \hat{Q})$. The $(\hat{I}, \hat{Q})$ values are used to address the PROM to output the corresponding stored metrics and determinations. This allows a very high speed pruning operation. The Viterbi decoder uses an accumulated history of the metrics received from the pruner to decode the coded bits.

In the embodiment illustrated in FIG. 3, the metrics output from pruner 62 are decoded by decoder 68 to recover a single bit corresponding to each single bit output on line 46 in the encoder of FIG. 2. These bits are reencoded with a rate 4/5 16-state convolutional encoder 70 (identical to encoder 48 in FIG. 2) to recreate the five coded bits corresponding to each set of four coded bits on line 46. The reencoded bits are used by a selector 74 to select hard decisions output from the pruner, after the subgroups have been delayed by a delay buffer 72 for an amount of time equal to the delay introduced by decoder 68. The selected hard decisions are combined with the recovered bits from decoder 68 in a serializer 76, to provide a trellis decoded output. For the sixteen QAM embodiment, encoder 70 is a rate 3/4 convolutional encoder used to recreate the four coded bits corresponding to each set of three coded bits on line 46.

The decoded output may exhibit a modest symbol error rate that must be further improved by an outer decoder. Thus, further processing of the decoded output, by deinterleaver 34 and a Reed-Solomon outer decoder 36 (FIG. 1) is used to recover the original information bits. An estimate of the output bit error rate, with a given input symbol error rate, for a t error-correcting, Reed-Solomon code can be easily computed in accordance with well known techniques, such as those shown in previously mentioned U.S. Pat. No. 5,233,629.

The present invention provides an optimized combination of concatenated coding for a QAM system. The system parameters include the Reed-Solomon block size M, the number of symbols in a Reed-Solomon block N, and the trellis coding rate p/q. It has been found that the specific combination of N, M, p and q in accordance with the present invention result in substantial and surprising advantages, particularly in the ability to provide improved coding gain, low-cost forward error correction (FEC) and clock circuits, improved symbol rate and bandwidth, a simplified interface with the information clock, and the ability to provide these advantages for both sixty-four QAM and sixteen QAM communication schemes.

The particular parameters provided by the present invention are a Reed-Solomon rate (M/N) of either 120/126 (without added synchronization control symbols), 121/127 or 122/128 with a trellis coding rate (p/q) of 4/5 or 3/4 depending on the QAM level used. This trellis coding rate can be provided by puncturing a standard rate 1/2 trellis code. Use of a convolutional interleaver parameterized by (B, N) is also advantageous, for example where B=32 and is the maximum burst length, and N=128 and is the separation between the interleaved Reed-Solomon blocks. It is noted that in accordance with the present invention, N is also the Reed-Solomon block size (e.g., 128 or 127 seven-bit Reed-Solomon symbols per block).

The specific parameters used in accordance with the present invention provide extremely advantageous relationships between the various clocks used in the encoder and decoder portions of a system for communicating digital data using trellis coded QAM. In one possible implementation, a 5.6 bit per symbol trellis code is combined with a singularly-extended (122, 128) Reed-Solomon code to provide small integer ratios in the clock tree, as follows:

TABLE 1

| Signal: | Frequency for 64 QAM: | Frequency for 16 QAM: | Relation to Master Clock: (64 QAM) | Relation to Master Clock: (16 QAM) |
|---|---|---|---|---|
| Input Data Clock ($f_{info}$) | 8.333 MHz | 8.333 MHz | 1/6 | 1/4 |
| QAM Symbol Clock ($f_{baud}$) | 5 MHz | 5 MHz | 1/16 | 3/20 |
| System Clock ($f_{clock}$) | 80 MHz | 33.333 MHz | 1 | 1 |
| Reed Solomon Symbol Clock ($f_{RS}$) | 2 MHz | 2 MHz | 1/40 | 3/50 |

It can be seen from Table 1 that for the sixty-four QAM embodiment, the system clock $f_{clock}$ is exactly sixteen times the QAM symbol clock $f_{baud}$, exactly six times the input data clock $f_{info}$, and exactly forty times the Reed-Solomon symbol clock $f_{RS}$. Further, $f_{baud}/f_{info}=3/8$. The use of a rate 4/5 trellis code in order to provide five three-bit output symbols (fifteen bits total) for each pair of seven-bit Reed-Solomon symbols input to the trellis coder ( fourteen bits total ) enables an integer relationship with the 5.6 bit per symbol trellis code for sixty-four QAM. Specifically, $(f_{clock}/f_{info}) \times (14/15)=5.6$, where $(f_{clock}/f_{info})=6$. The small integer relations (6, 16) between the master clock, input data rate and QAM symbol period make it easy to provide the necessary clocks with a fifty percent duty cycle using a single phase lock loop.

For the sixteen QAM embodiment, $f_{clock}$ is 6⅔ times $f_{baud}$, and four times $f_{info}$. Further, $f_{baud}/f_{info}=3/5$. The use of a rate 3/4 trellis code in order to provide four two-bit output symbols (eight bits total) for each seven-bit Reed-Solomon symbol input to the trellis coder enables an integer relationship with the 3.5 bit per symbol trellis code. Specifically, $(f_{clock}/f_{info}) \times (7/8)=3.5$, where $(f_{clock}/f_{info})=4$.

In accordance with the present invention, each Reed-Solomon block comprises N seven-bit coded symbols of which M coded symbols represent information to be communicated. The remaining N-M coded symbols comprise error correcting redundancy, specifically parity information. Thus, for a 128 symbol Reed-Solomon block, 122 symbols carry the actual information to be communicated, and the remaining six symbols provide parity information for use at the receiver.

The use of a 121/127 or 122/128 Reed-Solomon rate facilitates the provision of synchronization symbols for use by the receiver in synchronizing the deinterleaver. In these embodiments, a seven-bit control symbol can be inserted for every F Reed-Solomon blocks in synchronization with the interleaver. The control symbols include synchronization symbols for use by the receiver, after being output from the trellis decoder, to determine the start of successive Reed-Solomon blocks and to synchronize the deinterleaver. As an example, where a Reed-Solomon rate of 122/128 is used, one control symbol can be inserted for every 1280 encoded Reed-Solomon symbols (F=10). Where a Reed-Solomon rate of 121/127 is used, one control symbol can be added for every 2540 encoded Reed-Solomon symbols (F=20). F defines the size (in blocks) of a frame of Reed-Solomon symbols. NF defines the number of symbols per frame. Thus, for a Reed-Solomon rate of 122/128, there are 128×10=1280 symbols per frame. For a Reed-Solomon rate of 121/127, there are 127×20=2540 symbols per frame.

In order for the control symbols to appear in proper order after the trellis decoder, they are inserted in the same symbol position in consecutive frames. It is noted that the sum of the number of blocks in a frame (F) and the number of overhead symbols inserted (S) (i.e., F+S) must be divisible by the interleaving depth I. Thus, where N is the Reed-Solomon block size in symbols, and S is the number of synchronization and "pipeline" (i.e., control) symbols:

For 64 QAM:

$$f_{info} = \frac{1}{2} f_{baud} \times \frac{5.6 \text{ bits}}{\text{symbol}} \times \frac{NF}{NF+S} \times \frac{N-6}{N}$$

$$= \frac{1}{2}(5) \times 5.6 \times \frac{1280}{1281} \times \frac{122}{128}$$

$$= 13.33\overline{3} \text{ MHz}$$

For 16 QAM:

-continued $$f_{info} = \frac{1}{2} f_{baud} \times \frac{3.5 \text{ bits}}{\text{symbol}} \times \frac{NF}{NF+S} \times \frac{N-6}{N}$$

$$= \frac{1}{2}(5) \times 3.5 \times \frac{1280}{1281} \times \frac{122}{128}$$

$$= 8.33\overline{3} \text{ MHz}$$

F and S can be adjusted as necessary to provide the exact relationship between the input data rate and the QAM symbol period desired for a given Reed-Solomon rate. At the decoder, the control symbols are removed before the symbols from the trellis decoder are input to the Reed-Solomon decoder.

A specific implementation of a plurality of Reed-Solomon blocks with inserted synchronization symbols is illustrated in FIG. 5. In this implementation, a superframe 100 includes six ten-block frames for a total of sixty Reed-Solomon blocks. Each Reed-Solomon block 106, 108 . . . 110 includes an information portion 102 comprising 122 information symbols and a parity portion 104 comprising six parity symbols, for a total 128 Reed-Solomon symbols per block. One control symbol is provided for each frame of ten blocks. Thus, there are a total of six control symbols 112 provided for the six frames (sixty blocks) of Reed-Solomon symbols. This translates into a total of 53,760 Reed-Solomon bits (128×7×60) and forty-two control bits (6×7) per superframe, or 7,686 symbols per superframe.

In a preferred embodiment, of the six control symbols, four are synchronization symbols. The four synchronization symbols provide a 28-bit synchronization pattern for detection at a decoder. Two different 28-bit synchronization patterns are provided. One is used for the I channel and the other is used for the Q channel. The decoder searches for these patterns for use in determining the end of each superframe as well as the channel (I or Q) to which the superframe pertains. The remaining two control symbols in each superframe can be used, for example, to identify whether the system is using sixty-four QAM or sixteen QAM, and for parity.

Additional control symbols can be added, if necessary, by increasing the size of the superframe. For each additional control symbol, another ten-block frame of Reed-Solomon symbols must be added to the superframe.

At the decoder, all of the parity symbols and control symbols are stripped from the superframe before further processing of the information data. Once carrier recovery synchronization is achieved, the trellis decoder resolves the puncture state ambiguity. Then, a search process is undertaken to identify the 28-bit synchronization code. Once this procedure is complete, frame synchronization is achieved by detecting the four seven-bit symbols transmitted every superframe for synchronization. The synchronization pattern is designed to have low correlation to shifted versions of itself on a symbol basis, and to other predictable sections of the incoming waveform, as well known in the art.

The specific implementation of the present invention is particularly adapted for use in the cable television environment. In this environment, the total interference of white noise, unequalized echoes, phase noise, fixed calculation errors, and all implementation loss is equivalent to 23–24 dB white noise. Under this condition, a sixty-four QAM scheme will generate about $1 \times 10^{-3}$ probability of symbol errors. In order to achieve a better symbol error performance, such as one error event per fifteen minutes, about seven dB of coding gain is required. The concatenated coding scheme of the present invention provides such gain.

At the receiver, a Viterbi decoder provides soft decisions and good coding gain. The Reed-Solomon decoder further reduces the probability of symbol errors. The provision of 4/5 or 3/4 trellis coding and 122/128 (or 120/126 or 121/127) Reed-Solomon concatenated coding will provide a coding gain of 7.2 dB for a 16-state Viterbi decoder. For a carrier-to-noise ratio (C/N) of 21.5 dB, the probability of Reed-Solomon block errors is $2 \times 10^{-8}$. The concatenated coding provides about 2.5 dB more coding gain than t=5 Reed-Solomon only coding. As noted above, at the rate 4/5 Viterbi decoder, every five symbols (fifteen bits) of input data will generate two symbols (fourteen bits) of Reed-Solomon data in the sixty-four QAM implementation. This simplifies the clock circuit by providing the integer relationships set forth above between the system clock, input data rate and QAM symbol period. The clock of the Reed-Solomon decoder can be derived by dividing the main clock by forty, to arrive at a clock rate of 2.0 MHz. For a rate 3/4 (sixteen QAM) Viterbi decoder, every four symbols (eight bits) of input data will generate one symbol (seven bits) of Reed-Solomon data.

In the system of the present invention, the total transmission rate is 9/8 of the information rate for the sixty-four QAM embodiment and 6/5 of the information rate for sixteen QAM. These ratios further simplify the clock design, allowing for the simple integer relationships mentioned above.

The relationship between the various clock signals in a specific sixty-four QAM embodiment of the invention is illustrated in FIG. 4. This figure illustrates the main components of the symbol decoder provided at a receiver, using a 4/5 rate trellis and a 121/127 Reed-Solomon rate. The master clock 80 operates at a frequency of 80.0 MHz. This clock is divided by six in a divider 88 to generate the 13.333 MHz input data rate, which is used by the Reed-Solomon decoder 92 of the forward error correction unit 94. The QAM symbol period clock, which is one-sixteenth of the master clock (i.e., 5.0 MHz) is applied to the trellis decoder unit 90 of the forward error correction unit 94. Simple relationships are also provided between the master clock frequency and the clocks utilized by the front end sixty-four QAM demodulator 82, back end sixty-four QAM demodulator 84, and the adaptive equalizer 86 of the receiver. Specifically, dividing clock 80 by a factor of four provides the 20.0 MHz clock, dividing by eight provides the 10.0 MHz clock, and dividing by forty provides the 2.0 MHz clock. Similar relationships will result in the sixteen QAM embodiment discussed herein.

It should now be appreciated that the present invention provides an optimal method for concatenating an outer symbol error correcting code with a punctured multidimensional trellis code for use in communicating digital data within an approximately six MHz bandwidth television channel. Encoder and decoder apparatus for effecting the method are also provided. The method and apparatus are particularly useful in communicating digital television signals via a cable television communication path, where low-cost decoders are required. The specific parameters provided in accordance with the present invention for the concatenated coding scheme improve coding gain, reduce the cost of the circuitry by providing simple integer relationships between the various required clocks, and work for both sixty-four QAM and sixteen QAM implementations.

Although the invention has been described in connection with a specific embodiment thereof, those skilled in the art will appreciate that numerous adaptations and modifications may be made thereto without departing from the spirit and scope of the invention as set forth in the claims.

What is claimed is:

1. A method for concatenating an outer symbol error correcting code with a multidimensional trellis code for use in communicating digital data within a standard bandwidth television channel, comprising the steps of:

encoding an input signal using said outer symbol error correcting code to produce successive blocks, each block comprising N seven-bit coded symbols of which M coded symbols represent information to be communicated and the remaining N-M coded symbols comprise error correcting information, wherein an outer symbol error correcting rate M/N is one of rates 120/126, 121/127, and 122/128;

interleaving said N seven-bit coded symbols in said blocks for transmission in an interleaved order to minimize the effects of burst errors when recovering the input signal after transmission;

convolutionally encoding said blocks using a rate 4/5 or 3/4 inner trellis code to provide output symbols; and multilevel modulating the output symbols for transmission over a communication path.

2. A method in accordance with claim 1 wherein said outer symbol error correcting code comprises a Reed-Solomon algorithm.

3. A method in accordance with claim 1 wherein:

said multilevel modulating step modulates said output symbols on I and Q components of a 64 Quadrature Amplitude Modulation constellation; and said inner trellis code provides five three-bit output symbols from two of said seven-bit coded symbols for modulation on one of said I and Q components.

4. A method in accordance with claim 1 wherein:

said multilevel modulating step modulates said output symbols on I and Q components of a 16 Quadrature Amplitude Modulation constellation; and said inner trellis code provides four two-bit output symbols from one of said seven bit coded symbols for modulation on one of said I and Q components.

5. A method for decoding the multilevel modulated output symbols provided in accordance with claim 1 comprising the steps of:

receiving and demodulating said output symbols from said communication path;

decoding the demodulated output symbols using a rate 4/5 or 3/4 decoding algorithm to recover said blocks of seven-bit coded symbols;

deinterleaving the recovered blocks; and decoding the seven-bit coded symbols in the deinterleaved blocks using an algebraic symbol error correcting algorithm that corresponds to said outer symbol error correcting code to recover said input signal.

6. A method in accordance with claim 5 wherein:

said outer symbol error correcting code comprises a Reed-Solomon algorithm;

said multilevel modulating step uses one of 16 Quadrature Amplitude Modulation and 64 to modulate said output symbols;

said decoding algorithm is a Viterbi decoding algorithm; and said algebraic symbol error correcting algorithm is a Reed-Solomon decoding algorithm.

7. A method in accordance with claim 1 in which said digital information is communicated with control data including synchronization data within said standard bandwidth television channel, comprising the further step of:

providing a seven-bit control symbol for each frame of ten blocks when said outer symbol error correcting rate M/N is 122/128, the addition of said control symbols effectively lowering M/N to an actual information data to transmitted data ratio of 120/126;

wherein said control symbols are convolutionally encoded with said blocks during said convolutional encoding step.

8. A method for decoding the multilevel modulated output symbols provided in accordance with claim 7 comprising the steps of:

receiving and demodulating said output symbols from said communication path;

decoding the demodulated output symbols using a rate 4/5 or 3/4 decoding algorithm to recover said blocks of seven-bit coded symbols and said control symbols;

stripping said control symbols from said recovered blocks;

deinterleaving the recovered blocks after said control symbols have been stripped therefrom; and decoding the seven-bit coded symbols in the deinterleaved blocks in response to said control symbols, using an algebraic symbol error correcting algorithm that corresponds to said outer symbol error correcting code to recover said input signal.

9. A method in accordance with claim 1 in which said digital information is communicated with control data including synchronization data within said standard bandwidth television channel, comprising the further step of:

providing a seven-bit control symbol for each frame of twenty blocks when said outer symbol error correcting rate M/N is 121/127, the addition of said control symbols effectively lowering M/N to an actual information data to transmitted data ratio of 120/126.

10. A method for decoding the multilevel modulated output symbols provided in accordance with claim 9 comprising the steps of:

receiving and demodulating said output symbols from said communication path;

decoding the demodulated output symbols using a rate 4/5 or 3/4 decoding algorithm to recover said blocks of seven-bit coded symbols and said control symbols;

stripping said control symbols from said recovered blocks;

deinterleaving the recovered blocks after said control symbols have been stripped therefrom; and decoding the seven-bit coded symbols in the deinterleaved blocks in response to said control symbols, using an algebraic symbol error correcting algorithm that corresponds to said outer symbol error correcting code to recover said input signal.

11. An encoder for concatenating an outer symbol error correcting code with a multidimensional trellis code to efficiently communicate digital data within a standard bandwidth television channel using multilevel modulation, comprising:

an outer symbol error encoder for encoding an input signal to produce successive data blocks, each block comprising N seven-bit coded symbols of which M coded symbols represent information to be communicated and the remaining N-M coded symbols comprise error correcting overhead, wherein an outer symbol error correcting rate M/N is one of rates 120/126, 121/127, and 122/128;

means for interleaving said N seven-bit coded symbols in said blocks for transmission in an interleaved order to minimize the effects of burst errors when recovering the input signal after transmission;

a rate 4/5 or 3/4 trellis encoder concatenated with said outer symbol error encoder for convolutionally encoding said blocks to provide output symbols; and means for multilevel modulating the output symbols for transmission over a communication path.

12. An encoder in accordance with claim 11 wherein said outer symbol error encoder comprises a Reed-Solomon encoder.

13. An encoder in accordance with claim 11 wherein:

said modulating means modulate said output symbols on I and Q components of a 64 Quadrature Amplitude Modulation constellation; and said trellis encoder provides five three-bit output symbols from two of said seven-bit coded symbols for modulation on one of said I and Q components.

14. An encoder in accordance with claim 11 wherein:

said modulating means modulate said output symbols on I and Q components of a 16 Quadrature Amplitude Modulation constellation; and said trellis encoder provides four two-bit output symbols from one of said seven bit coded symbols for modulation on one of said I and Q components.

15. An encoder in accordance with claim 11 in which said digital information is communicated with control data including synchronization data within said standard bandwidth television channel, further comprising:

means for providing a seven-bit control symbol for each frame of ten blocks when said outer symbol error correcting rate M/N is 122/128, the addition of said control symbols effectively lowering M/N to an actual information data to transmitted data ratio of 120/126;

wherein said control symbols are convolutionally encoded with said blocks in said trellis encoder.

16. A decoder for decoding the convolutionally encoded blocks provided by the encoder of claim 15 comprising:

means for receiving and demodulating said output symbols from said communication path;

an inner decoder for decoding the demodulated output symbols using a rate 4/5 or 3/4 code to recover said blocks of seven-bit coded symbols and said control symbols;

means for stripping said control symbols from said recovered blocks;

means for deinterleaving the recovered blocks after said control symbols have been stripped therefrom; and an outer symbol error decoder concatenated with said inner decoder for decoding the blocks from said inner decoder in response to said control symbols to recover said input signal.

17. An encoder in accordance with claim 11 in which said digital information is communicated with control data including synchronization data within said standard bandwidth television channel, further comprising:

means for providing a seven-bit control symbol for each frame of twenty blocks when said outer symbol error correcting rate M/N is 121/127, the addition of said control symbols effectively lowering M/N to an actual information data to transmitted data ratio of 120/126.

18. A decoder for decoding the convolutionally encoded blocks provided by the encoder of claim 17 further comprising:

means for receiving and demodulating said output symbols from said communication path;

an inner decoder for decoding the demodulated output symbols using a rate 4/5 or 3/4 decoding algorithm to recover said blocks of seven-bit coded symbols and said control symbols;

means for stripping said control symbols from said recovered blocks;

means for deinterleaving the recovered blocks after said control symbols have been stripped therefrom; and an outer symbol error decoder concatenated with said inner decoder for decoding the blocks from said inner decoder in response to said control symbols to recover said input signal.

19. A decoder for decoding the convolutionally encoded blocks provided by the encoder of claim 11 comprising:

means for receiving and demodulating the output symbols from said communication path;

an inner decoder for decoding the demodulated output symbols using a rate 4/5 or 3/4 code to recover said blocks of seven-bit coded symbols;

means for deinterleaving the recovered blocks; and an outer symbol error decoder concatenated with said inner decoder for decoding the blocks from said inner decoder to recover said input signal.

20. A decoder in accordance with claim 19 wherein:

said outer symbol error encoder comprises a Reed-Solomon encoder;

said modulator is one of a 16 Quadrature Amplitude Modulation and 64 Quadrature Amplitude Modulation modulator;

said inner decoder is a Viterbi decoder; and said outer symbol error decoder is a Reed-Solomon decoder.

21. An encoder in accordance with claim 11 wherein said interleaver means comprise a $2^n/N$ interleaver, where n is an integer from 1 to 6 and $2^n$ represents a maximum burst length to be dispersed over the N seven-bit coded symbols in one of said blocks.

22. A decoder for multilevel modulated digital data communicated in a standard bandwidth television channel comprising:

means for receiving and demodulating convolutionally encoded output symbols from a communication path;

an inner decoder for decoding the demodulated output symbols using a rate 4/5 code to recover interleaved blocks of data, each block comprising N seven-bit coded symbols of which M coded symbols represent information to be recovered and the remaining N-M coded symbols comprise error correcting overhead, wherein an outer symbol error correcting rate M/N is one of rates 120/126, 121/127, and 122/128;

means for deinterleaving the recovered blocks; and an outer symbol error decoder concatenated with said inner decoder for decoding the blocks from said inner decoder to recover a transmitted information signal.

23. A decoder in accordance with claim 22 wherein:

said multilevel modulated digital data is one of 16 Quadrature Amplitude Modulation and 64 Quadrature Amplitude Modulation data;

said inner decoder is a Viterbi decoder; and said outer symbol error decoder is a Reed-Solomon decoder.

24. A decoder in accordance with claim 22 wherein:

said outer symbol error correcting rate M/N is either 122/128 or 121/127;

said inner decoder also recovers a seven-bit control symbol for each frame of F blocks, where F=10 when M/N is 122/128 and F=20 when M/N is 121/127, said control symbols effectively lowering M/N to an actual information data to transmitted data ratio of 120/126; and said deinterleaving means deinterleave the recovered blocks after stripping said control symbols therefrom.

25. A decoder in accordance with claim 24 wherein:

said multilevel modulated digital data is one of 16 Quadrature Amplitude Modulation and 64 Quadrature Amplitude Modulation data;

said inner decoder is a Viterbi decoder; and said outer symbol error decoder is a Reed-Solomon decoder.

* * * * *